United States Patent
Fairgrieve

[19]

[11] Patent Number: 6,031,424
[45] Date of Patent: Feb. 29, 2000

[54] DIFFERENTIAL AMPLIFIER WITH IMPROVED VOLTAGE GAIN USING OPERATIONAL AMPLIFIERS TO ELIMINATE DIODE VOLTAGE DROPS

[75] Inventor: Alexander Fairgrieve, Menlo Park, Calif.

[73] Assignee: Elantec Semiconductor, Inc., Milpitas, Calif.

[21] Appl. No.: 09/150,788

[22] Filed: Sep. 10, 1998

Related U.S. Application Data

[63] Continuation-in-part of application No. 08/705,596, Aug. 30, 1996, Pat. No. 5,812,026.

[51] Int. Cl.[7] .................................................. H01H 85/143
[52] U.S. Cl. .................................... 330/260; 330/252
[58] Field of Search ................................ 330/260, 252, 330/85, 311, 310

[56] References Cited

U.S. PATENT DOCUMENTS

| | | | |
|---|---|---|---|
| 3,684,973 | 8/1972 | Duck | 330/30 R |
| 4,626,795 | 12/1986 | Tanaka et al. | 330/257 |
| 5,144,169 | 9/1992 | Hirabayashi et al. | 307/490 |
| 5,168,243 | 12/1992 | Feliz et al. | 330/252 |
| 5,184,086 | 2/1993 | Inohana et al. | 330/252 |
| 5,345,237 | 9/1994 | Kouno et al. | 341/156 |

*Primary Examiner*—Robert Pascal
*Assistant Examiner*—Henry Choe
*Attorney, Agent, or Firm*—Fliesler, Dubb, Meyer & Lovejoy

[57] ABSTRACT

The present invention is a differential amplifier with circuitry to eliminate the effect of transistor impedance other than an actual load impedance on voltage gain. The circuitry includes a pair of transistors 400 and 402, each with a base connected to a respective input of the differential amplifier along with a similar base connection of a respective one of transistors 100 and 102, and an emitter connected to a current source 404. A collector of transistor 400 is connected through transistor 410 to the emitter of a current sink transistor 306, while the collector of transistor 402 is connected through transistor 412 to the emitter of a current sink transistor 308. Operational amplifiers (opamps) 420 and 422 serve as voltage followers to connect the collector of transistor 100 to the base of transistor 412, and the collector of transistor 102 to the base of transistor 410. An inverting input of the opamps 420 and 422 are connected to the emitter of transistors 410 and 412 to eliminate the effect of a emitter to base voltage drop in transistors 410 and 412. With such components, loading at the outputs $V_{OUT}$ and $V_{OUTB}$ is substantially limited to the actual load provided by transistors 306 and 308 and resistors 316 and 318.

17 Claims, 9 Drawing Sheets

DIFFERENTIAL AMPLIFIER WITH IMPROVED VOLTAGE GAIN USING OPERATIONAL AMPLIFIERS TO ELIMINATE DIODE VOLTAGE DROPS

CROSS-REFERENCE TO RELATED APPLICATION

This is a continuation-in-part of U.S. patent application Ser. No. 08/705,596 entitled "Differential Amplifier With Improved Voltage Gain", by Fairgrieve, filed Aug. 30, 1996, now U.S. Pat. No. 5,812,026, and claims priority therefrom.

BACKGROUND OF THE INVENTION

1. Field of the Invention

This invention relates to differential amplifiers. More particularly, this invention relates to differential amplifiers with circuitry to increase output voltage gain.

2. Description of the Related Art

FIG. 1 shows a conventional differential amplifier. The differential amplifier includes PNP transistors 100 and 102 with input voltages $V_{IN}$ and $V_{INB}$ received at their respective bases, outputs $V_{OUT}$ and $V_{OUTB}$ provided at their respective collectors, and emitters connected to a current source 104.

Transistors 100 and 102 are shown as PNP transistors to emphasize the undesirability of Early Voltage, because PNP transistors typically have a much lower Early Voltage than NPN transistors and provide a more dominant limitation on output voltage gain. Transistors 100 and 102 may, however, be NPN transistors, and the Early Voltage will still limit output voltage gain.

With sizes of transistors 100 and 102 being equal and loading at the outputs $V_{OUT}$ and $V_{OUTB}$ being equal, voltage gain of a differential amplifier can be expressed as $V_{GAIN} = g_m R_{Leff}$, where $g_m$ is the transconductance of one the bipolar transistors 100 or 102, and $R_{Leff}$ is the effective load impedance at one of the outputs of the transistor, such as at $V_{OUT}$ or $V_{OUTB}$. In general, $R_{Leff}$ is the parallel combination of the actual load, such as provided by resistors 106 or 108, and the output impedance of one of the transistors of the differential amplifier, such as 100 or 102. The highest gain can be achieved when the actual load impedance is infinite, or at least substantially higher than a transistor output impedance.

FIG. 2 illustrates that to provide an actual load with a very high impedance, ideal current sinks 206 and 208 may be used in place of load resistors 106 and 108 of FIG. 1. With the actual load impedance of infinity using ideal current sinks 206 and 208, the highest obtainable voltage gain is then limited solely by the output impedance of transistors 100 and 102. Gain for the circuit of FIG. 2 can, thus, be simplified to $V_{gain} = V_{EARLY}/Vt$, where Vt is KT/q=T/11,600, with T being temperature in Kelvin and $V_{EARLY}$ being the forward Early Voltage of one of the transistors of the differential amplifier such as transistor 100 or transistor 102. Note that components carried over from FIG. 1 to FIG. 2 are similarly labeled, as will be components carried over in subsequent drawings.

FIG. 3 illustrates circuitry conventionally used for providing current sinks 206 and 208 of FIG. 2, but with a finite yet very high effective output impedance. As shown, current sink 206 is provided by an NPN transistor 306 having a collector connected to the collector of transistor 102, and an emitter connected through a resistor 316 to a lower power supply rail (V−). Current sink 208 is provided by an NPN transistor 308 having a collector connected to the collector of transistor 100, and an emitter connected through a resistor 318 to V−. Bases of transistors 306 and 308 are provided by a voltage reference $V_{REF}$. Use of degeneration, or negative feedback provided by resistors 316 and 318 on the emitters of the NPN current sink transistors 306 and 308 ensures an NPN output impedance vastly greater than the output impedance of one of PNP transistors 101 or 102.

For maximizing gain, the Early Voltage of the PNP transistors needs to be as high as possible. To achieve a higher frequency response, in general, transistor base widths are made thinner. One undesirable effect of having a thinner transistor base width is that the forward Early Voltage becomes lower.

SUMMARY OF THE INVENTION

The present invention includes circuitry to eliminate the effect of transistor impedance other than actual load impedance on voltage gain of a differential amplifier.

The present invention is a differential amplifier which includes, referring to FIG. 4, a pair of transistors 400 and 402, each with a base connected to a respective input of the differential amplifier in correspondence with bases of respective transistors 100 and 102, and an emitter connected to a current source 404. A collector of transistor 400 is connected through the emitter to collector path of a transistor 410 to the emitter of transistor 306. The collector of transistor 402 is connected through the emitter to collector path of a transistor 412 to the emitter of transistor 308. An operational amplifier (opamp) 420 has an output connected to the base of transistor 410, an inverting input connected to the emitter of transistor 410 and a noninverting input connected to the collector of transistor 102. An opamp 422 has an output connected to the base of transistor 412, an inverting input connected to the base of transistor 412, and a noninverting input connected to the collector of transistor 100. With such components, loading at the outputs $V_{OUT}$ and $V_{OUTB}$ is substantially limited to the actual load provided by transistors 306 and 308 and resistors 316 and 318.

The opamps 420 and 422 serve as voltage followers to assure the collector voltages of transistors 100 and 402 are substantially equal and the collector voltages of transistors 102 and 400 are substantially equal. A connection from transistor 410 to the inverting input of opamp 420 allows compensation for the voltage drop from the emitter to base of transistor 410. A connection from transistor 412 to the inverting input of opamp 422 allows compensation for the voltage drop from the emitter to base of transistor 412.

Although the present invention is summarized above for use with a differential amplifier having BJT transistors, transistor types may be changed to complementary metal oxide (CMOS) transistors.

BRIEF DESCRIPTION OF THE DRAWINGS

Further details of the present invention are explained with the help of the attached drawings in which.

DETAILED DESCRIPTION

Figure 1:
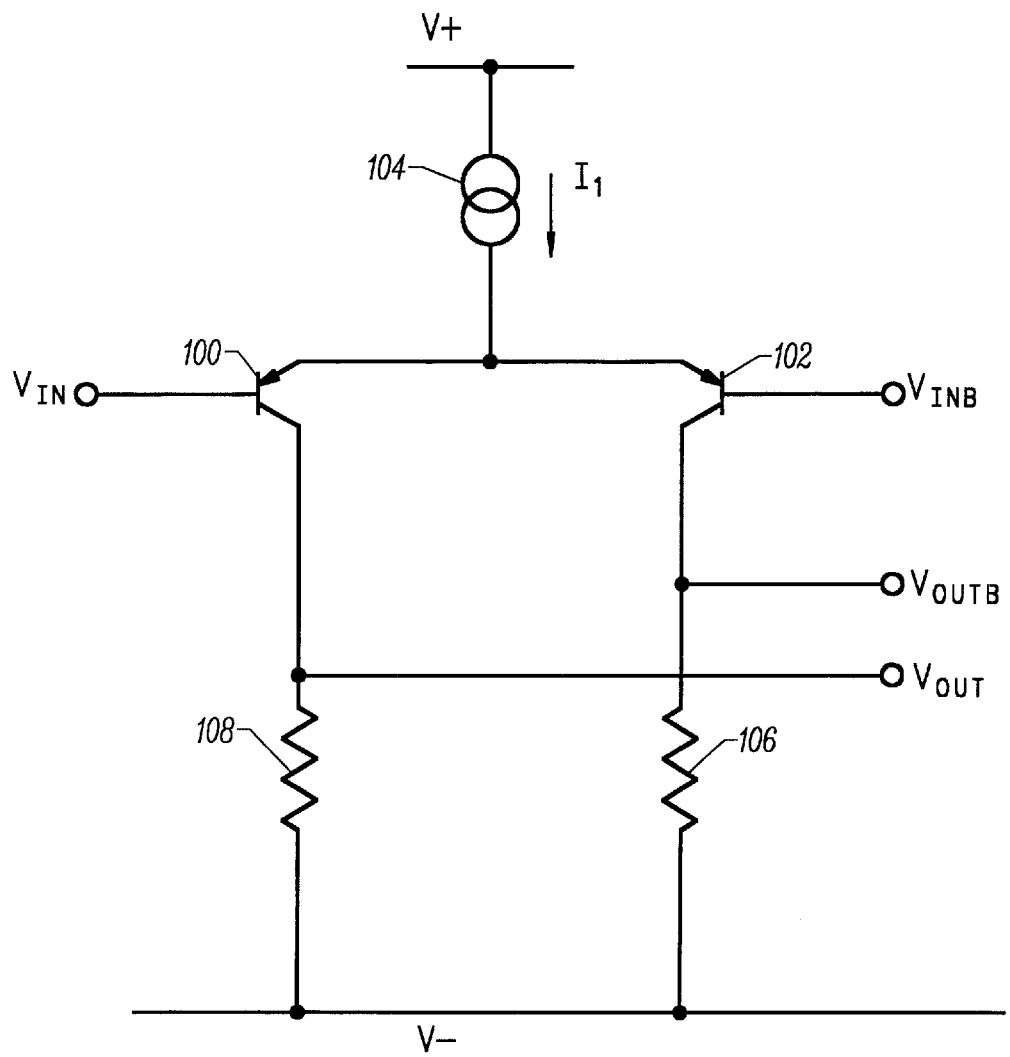
FIG. 1 shows a conventional differential amplifier.
Figure 2:
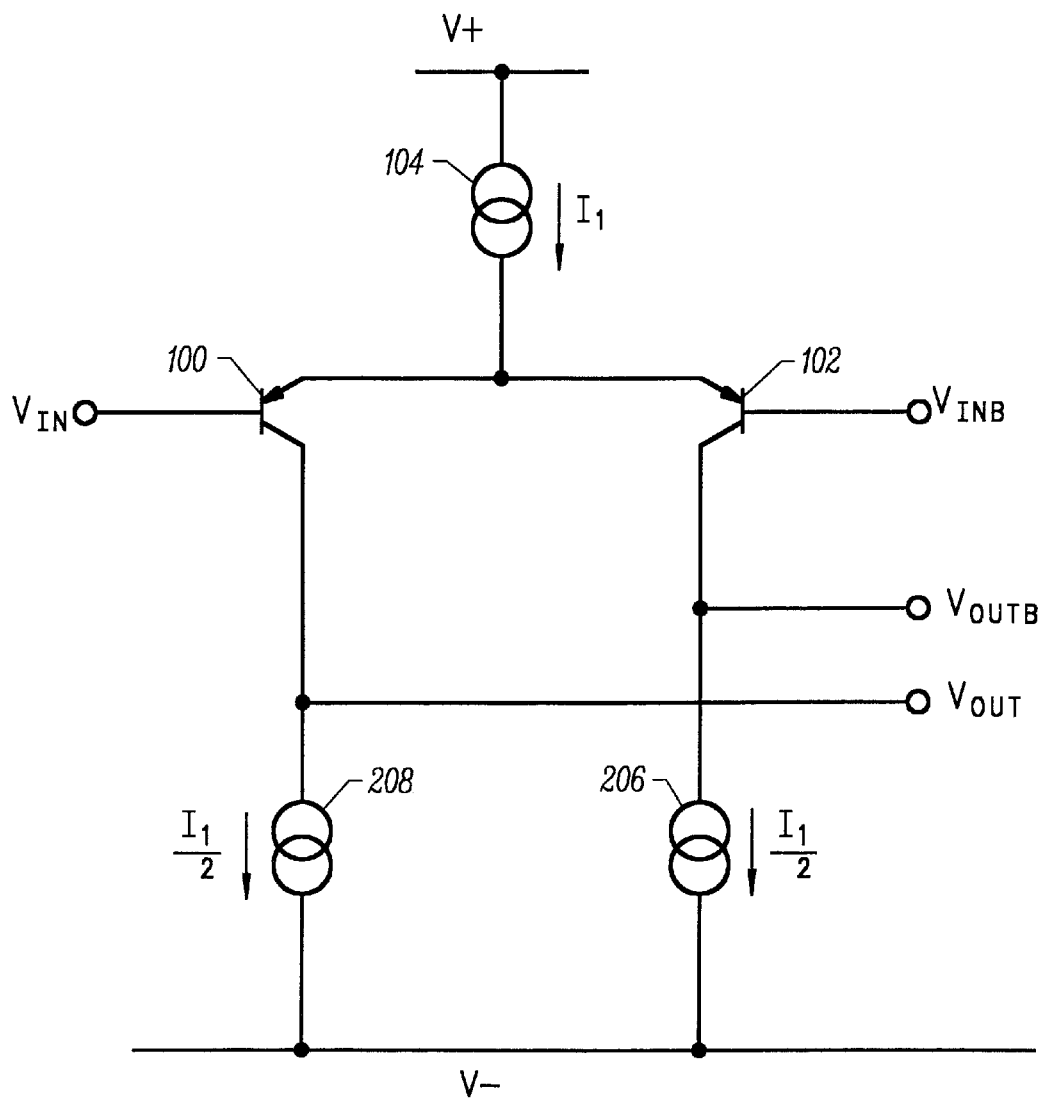
FIG. 2 illustrates ideal current sinks provided to replace load resistors used at the output of the differential amplifier of FIG. 1.
Figure 3:
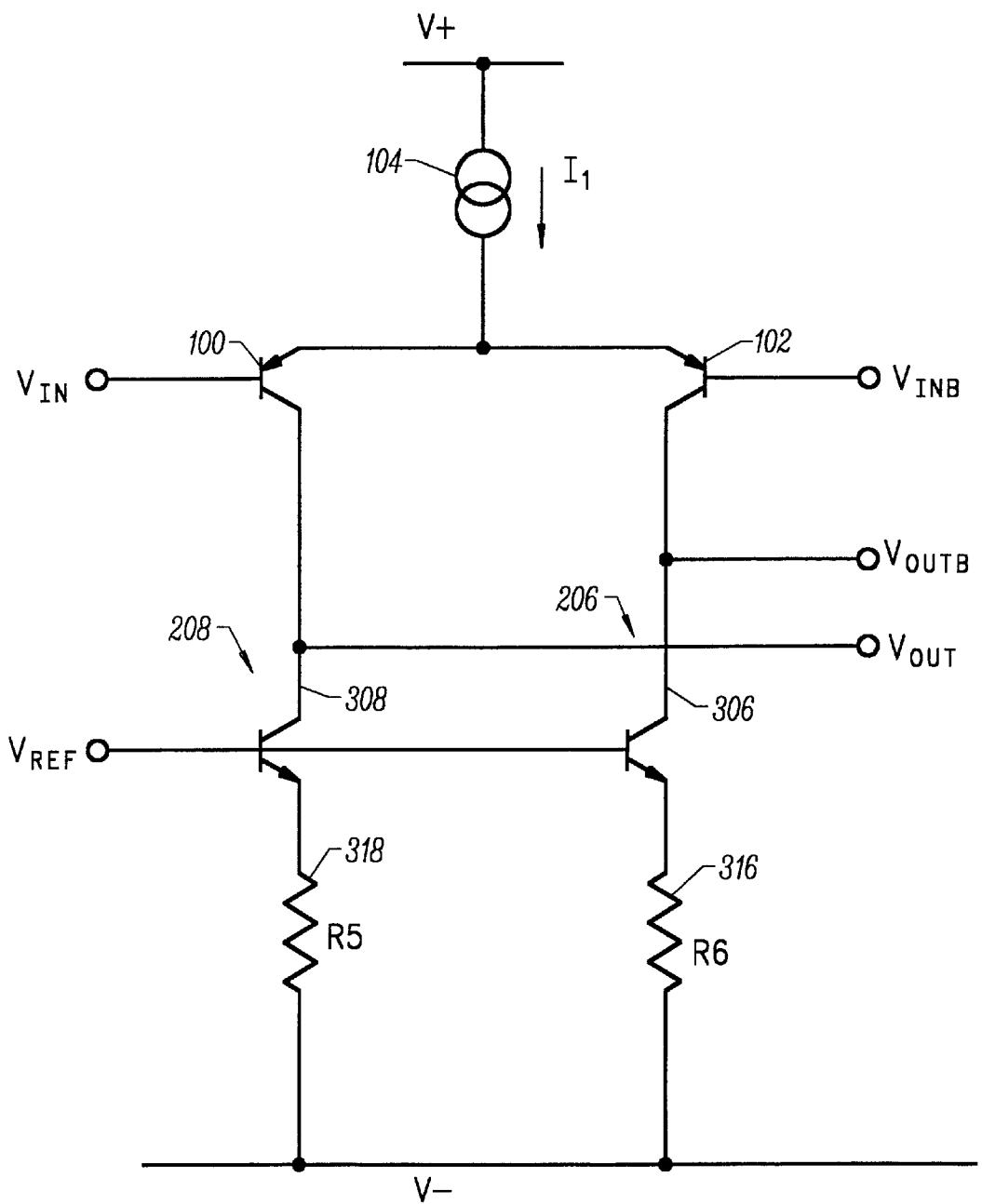
FIG. 3 shows conventional circuitry for the current sinks 206 and 208 of FIG. 2.
Figure 4:
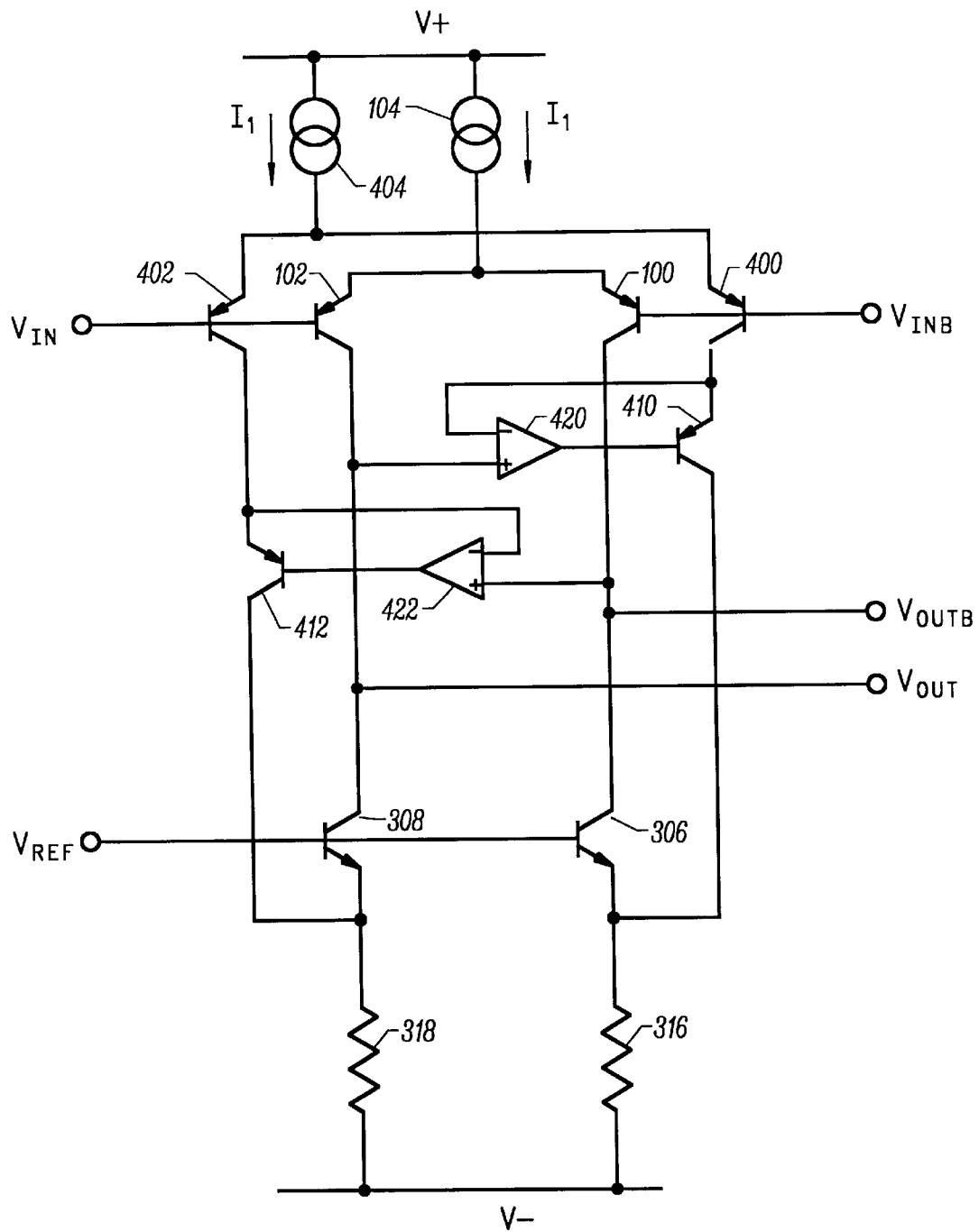
FIG. 4 shows the differential amplifier of FIG. 3 along with circuitry of the present invention utilized to eliminate the effect of Early Voltage.

FIG. 4 shows the differential amplifier of FIG. 3 along with circuitry of the present invention utilized to eliminate the effect of Early Voltage in transistors 100 and 102. The additional circuitry to eliminate the effect of Early voltage includes a current source 404 along with transistors 400 and 402 having emitters connected to the current source 404. The bases of the transistors 400 and 402 are connected to the respective inputs $V_{IN}$ and $V_{INB}$ of the differential amplifier.

The additional circuitry to eliminate the effect of Early voltage further includes transistors 410 and 412. An emitter of transistor 410 is connected to the collector of transistor 400, while the collector of transistor 410 is connected to the emitter of transistor 306. The emitter of transistor 412 is connected to the collector of transistor 402, while the collector of transistor 412 is connected to the emitter of transistor 308.

The circuitry to eliminate the effect of Early Voltage further includes opamps 420 and 422. Opamp 420 has an output connected to the base of transistor 410, an inverting input connected to the emitter of transistor 410 and a noninverting input connected to the collector of transistor 102. Opamp 422 has an output connected to the base of transistor 412, and inverting input connected to the base of transistor 412, and a noninverting input connected to the collector of transistor 100.

The opamps 420 and 422 serve as voltage followers to assure the collector voltages of transistors 100 and 402 are substantially equal and the collector voltages of transistors 102 and 400 are substantially equal. A connection from transistor 410 to the inverting input of opamp 420 allows compensation for the voltage drop from the emitter to base of transistor 410. A connection from transistor 412 to the inverting input of opamp 422 allows compensation for the voltage drop from the emitter to base of transistor 412.

Figure 5:
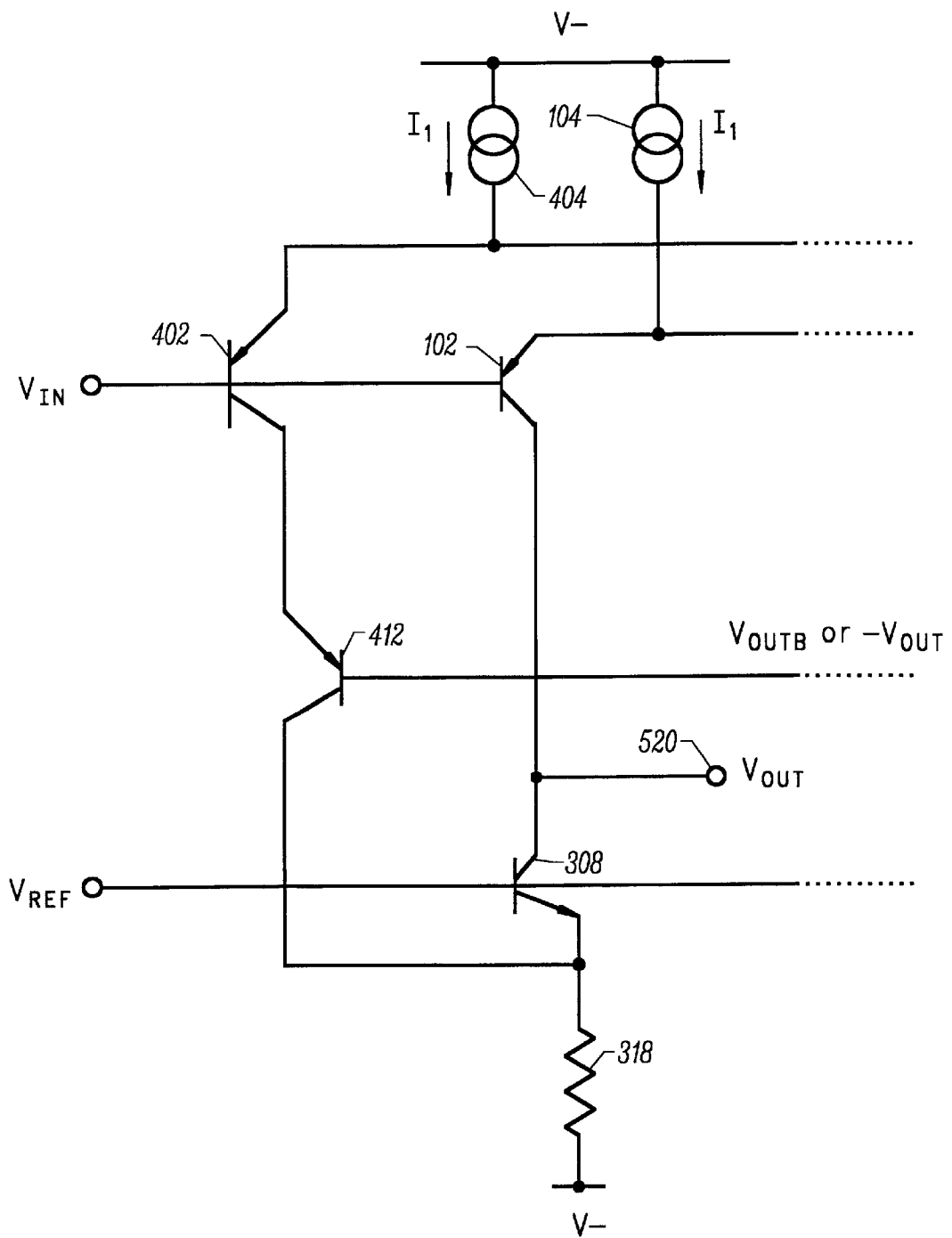
FIG. 5 which shows half the circuit of FIG. 4 without an opamp.

Due to symmetry of the circuit of FIG. 4, operation of the circuit will be described with respect to FIG. 5 which shows half the circuit of FIG. 4 without the opamp 422. To describe operation, the output impedance of the PNP transistors is first defined as $R_{OP}$, while the output impedance of the NPN transistors is defined as $R_{ON}$. Further, the collector/emitter current ratio for the NPN transistors is defined as $\alpha_N$, while the collector/emitter current ratio for the PNP transistors is defined as $\alpha_P$.

With the above definitions, we now assume that a small change in voltage occurs at $V_{OUT}$, defined as $\delta VOUT$. Change in collector currents of transistors 102, 402 and 412, the collector currents being defined respectively as $Ic_{102}$, $Ic_{402}$ and $Ic_{412}$, can be derived as follows:

$$\delta Ic_{102} = \delta V_{OUT}/R_{OP}$$

$$\delta Ic_{402} = \delta V_{OUT}/R_{OP}$$

$$\delta Ic_{412} = (-\delta V_{OUT}/R_{OP})\alpha_P$$

By Kirchoff's law, the current $Ic_{308}$ at the collector of the NPN transistor 308 includes the current $Ic_{412}$ reduced by $\alpha_N$ due to current provided to the base of transistor 308. Thus, the change in collector current of transistor 308 is derived as follows:

$$\delta Ic_{308} = (\delta V_{OUT}/R_{ON}) + (\alpha_N \delta Ic_{412})$$

$$= (\delta V_{OUT}/R_{ON}) + (\alpha_N \alpha_P(-\delta V_{out}/R_{OP}))$$

Thus, the total change in current at the node 520 supplying $V_{OUT}$ is derived as follows:

$$\delta Ic_{520} = \delta Ic_{308} + \delta Ic_{102}$$

$$= (\delta V_{OUTr}/R_{ON}) - (\alpha_N \alpha_p(\delta V_{OUTr}/R_{OP})) + (\delta V_{OUT}/R_{OP})$$

With $\alpha_P \alpha_N$ approximately equal to 1, the net change in current at the node 520, $Ic_{520} = (\delta V_{OUT}/R_{ON})$. The impedance at the output node 520 will, thus, be $R_{ON}$.

Thus, use of the circuitry of the present invention prevents $R_{OP}$ of the PNP transistors from affecting impedance at the gain node 520. Gain is limited only by the output impedance of the current sink transistors, such as transistor 308. With the circuit of the present invention gain improvement can be as high as 10 to 100 times.

To provide even higher gain, instead of configuring current sources 104 and 404 to supply the same current, current supplied by current source 404 can be controlled to be slightly greater than current supplied by current source 104. The additional current is provided to overcome losses due to $\alpha_N$ and $\alpha_P$ in transistors 306, 308, 410 and 412. In the equations derived above, $\alpha_N$ and $\alpha_P$ are both assumed to be 1, but in reality are slightly less. By compensating for the amount that $\alpha_N$ and $\alpha_P$ are less than 1 by supplying slightly more current from current source 404 and current source 104, gain will be closer to gain assumed with ideal components.

Figure 6:
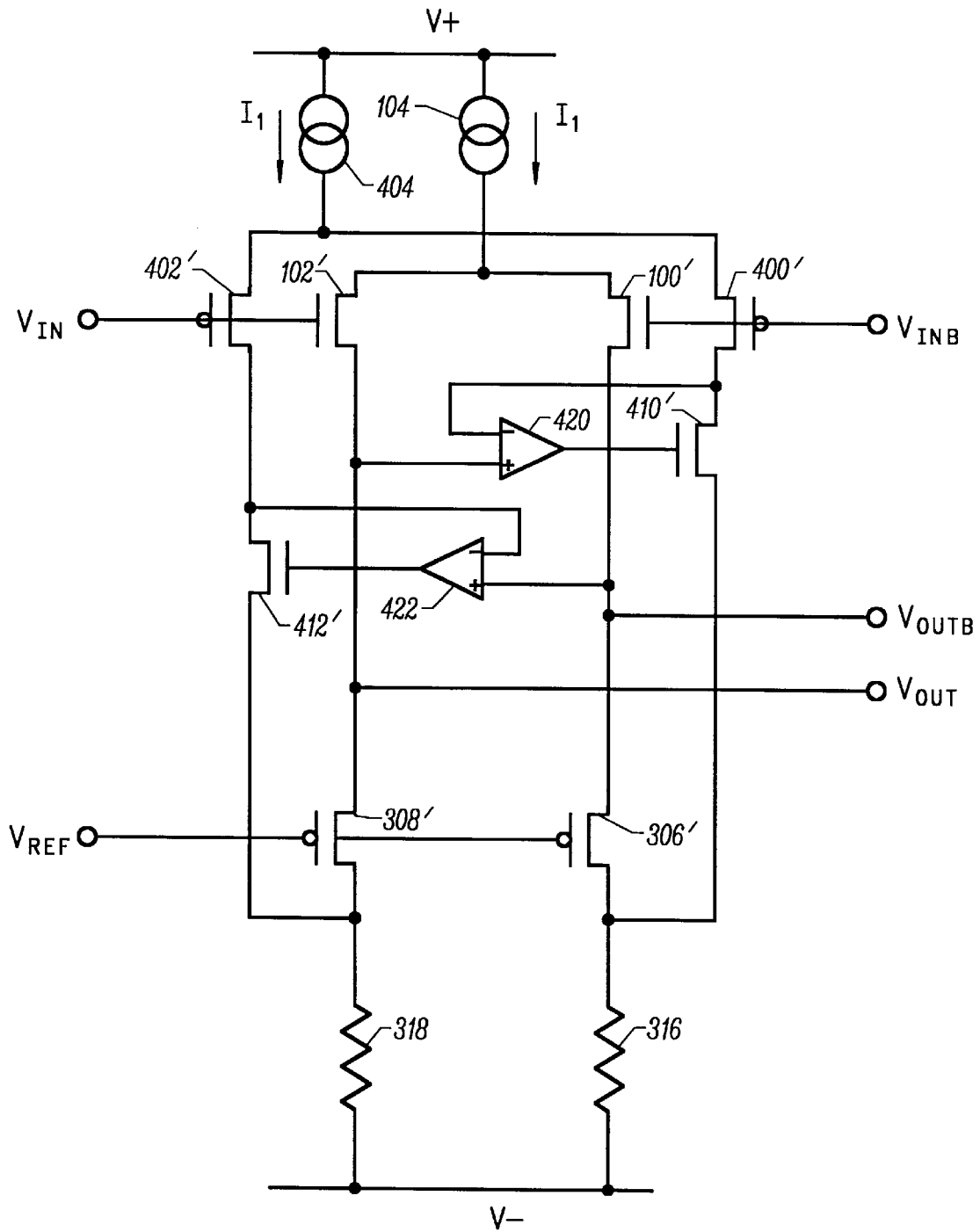
FIG. 6 shows a differential amplifier of the present invention with CMOS components.

The differential amplifier of the present invention can also be implemented with CMOS transistors as shown in FIG. 6, as opposed to the BJT transistors of FIG. 4. The circuit of FIG. 6 replaces the PNP transistors 100, 102, 400, 402, 410 and 412 of FIG. 4 with respective NMOS transistors 100', 102', 400', 402', 410' and 412'. The circuit of FIG. 6 further replaces the NPN transistors 306 and 308 of FIG. 4 with respective PMOS transistors 306' and 308'. With CMOS circuitry configured as shown in FIG. 6, loading at the outputs $V_{OUT}$ and $V_{OUTB}$ will be substantially limited to the actual load provided by transistors 306', 308', 316 and 318 similar to the circuit of FIG. 4.

Figure 7:
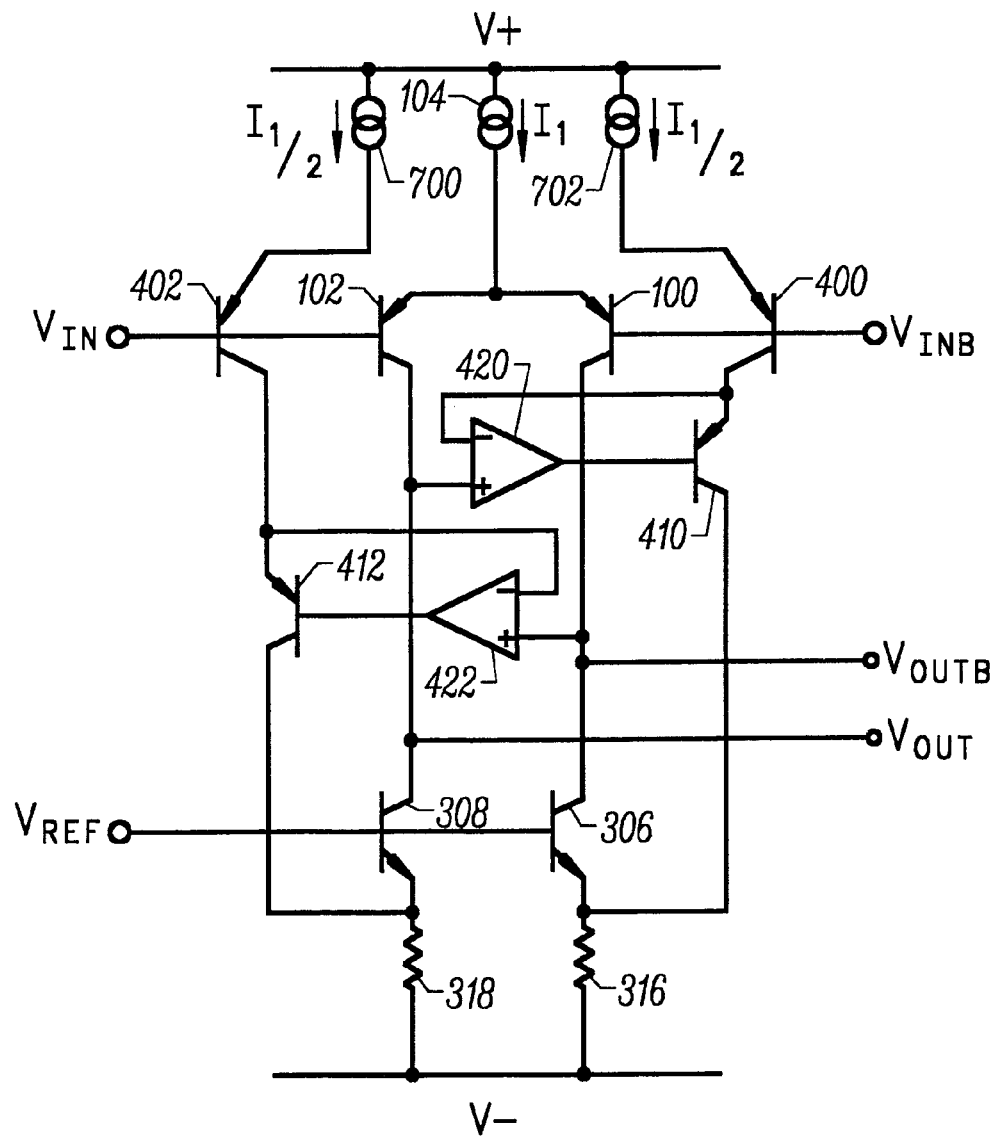
FIG. 7 shows the circuit of FIG. 4 modified to include two current sources to replace the single current source.

FIG. 7 shows the circuit of FIG. 4 modified to include two current sources 700 and 702 to replace the single current source 404 used in previous drawings. The current sources 700 and 702 are each configured to supply half of the current supplied by current source 104. Use of two current sources 700 and 702, as shown, instead of a single current source 404, as shown previously, enables input impedance at inputs $V_{IN}$ and $V_{INB}$ to be increased.

Figure 8:
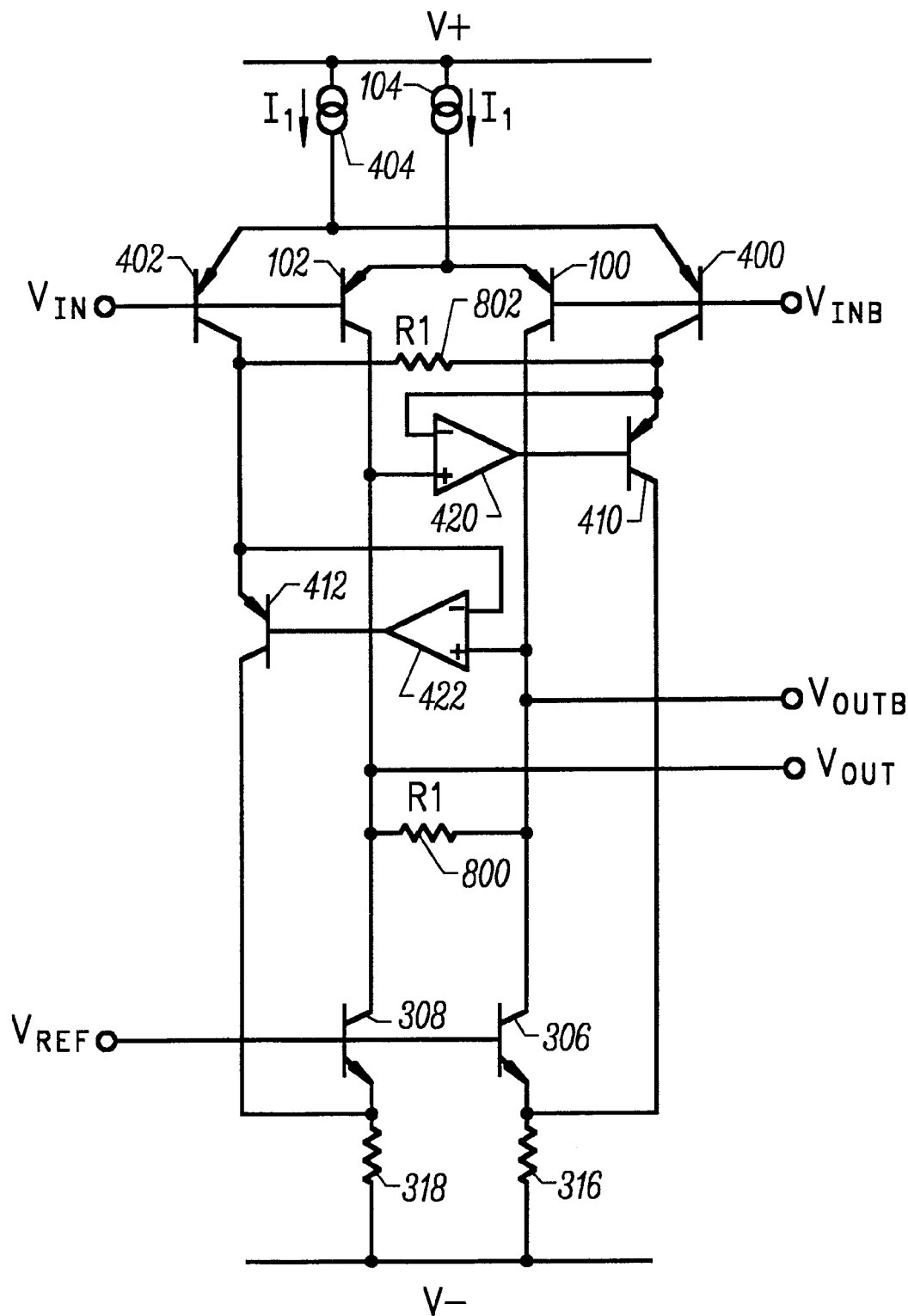
FIG. 8 shows the circuit of FIG. 4 with loading of the outputs $V_{OUT}$ and $V_{OUTB}$ provided other than by current sinks, and compensation for such loading.

FIG. 8 shows the circuit of FIG. 4 with loading of the outputs $V_{OUT}$ and $V_{OUTB}$ provided other than by current sinks, and compensation for such loading. In FIG. 8, a resistor 800 is added across the outputs $V_{OUT}$ and $V_{OUTB}$ having a resistance value $R_1$, and a resistor 802 is connected across the collectors of transistors 400 and 402 having an equal resistance value $R_1$ to compensate for resistor 800. With the circuit configured as shown, load currents due to resistors 800 and 802 will be cancelled, maintaining the impedance of node $V_{OUT}$ as $R_{ON}$.

The resistor 800 may not necessarily be a discrete component, but instead may take into account loading at the outputs $V_{OUT}$ and $V_{OUTB}$ that is not possible to remove. Although loading is shown as resistor 800, loading can be an impedance with both real and imaginary components. An equal impedance may likewise be used in place of resistor 702 to compensate for both real and imaginary components of loading. With compensation for imaginary components of loading, parasitic capacitance on the outputs can be cancelled out, allowing a designer to define dominant poles by use of controlled components and eliminating the need to include the effects of unwanted parasitic capacitance in a design.

Figure 9:
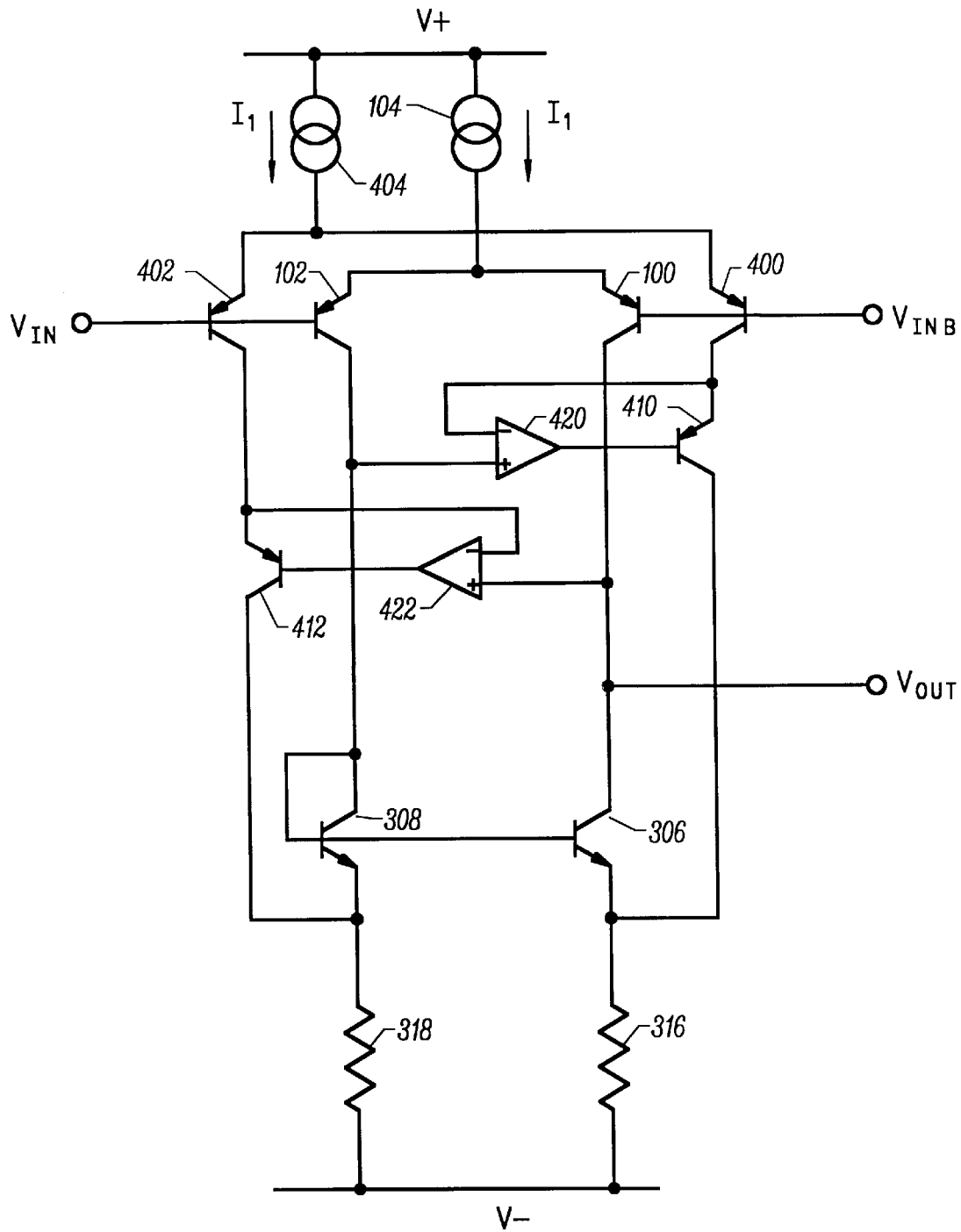
FIG. 9 shows the circuit of FIG. 4 modified to provide a single ended output, as opposed to a differential output.

Although the present invention is described above for use with a differential amplifier provided with a differential output $V_{OUT}$ and $V_{OUTB}$, the present invention can be utilized with a differential amplifier providing a single ended output $V_{OUT}$ as shown in FIG. 9. As with circuitry described above with respect to a differential output, circuitry of the present invention utilized with a single ended output will provide the same advantages of high voltage gain and load cancellation.

Although the invention has been described above with particularity, this was merely to teach one of ordinary skill in the art how to make and use the invention. Many modifications will fall within the scope of the invention, as that scope is defined by the claims which follow. For example, although circuitry is shown using BJT transistors having a particular type, such as in FIG. 4 where transistors 100, 102, 400, 402, 410, and 412 are shown as PNP devices and transistors 306 and 308 are shown as NPN devices, transistor types may be interchanged. Similarly, the NMOS and PMOS transistor types can be interchanged in FIG. 6. Further, although the circuitry of FIGS. 7–9 modify the circuitry of FIG. 4 which uses BJT transistors, similar modifications can be made to the CMOS circuitry of FIG. 5.

What is claimed is:

1. A differential amplifier comprising:

a first current source;

a first pair of transistors, each transistor in the first pair having a base coupled to an input of the differential amplifier, and an emitter to collector path coupled on a first end to the first current source and on a second end to an output of the differential amplifier;

a second pair of transistors, a first transistor in the second pair having an emitter to collector path coupled on a first end to the second end of the emitter to collector path of a first transistor in the first pair and coupled on a second end through a resistive element to ground and having a base connected to a voltage reference, and a second transistor in the second pair having an emitter to collector path coupled on a first end to the second end of the emitter to collector path of a second transistor of in the first pair and coupled on a second end through a resistive element to ground and having a base connected to the voltage reference;

a second current source means;

a third pair of transistors, each transistor in the third pair having an emitter to collector path coupled on a first end to the second current source means, a first transistor in the third pair having a base coupled to a base of a first transistor in the first pair, and a second transistor in the third pair having a base coupled to a base of a second transistor in the first pair;

a first operational amplifier having a first input coupled to the second end of the collector to emitter path of the first transistor of the first pair, a second input, and an output;

a first operational amplifier connected transistor having an emitter to collector path coupled on a first end to a second end of the collector to emitter path of the second transistor in the third pair and to the second input of the first operational amplifier, a second end of the collector to emitter path of the first operational amplifier being coupled to the second end of the collector to emitter path of the second transistor in the second pair, and a base of the first operational amplifier connected transistor coupled to an output of the first operational amplifier;

a second operational amplifier having a first input coupled to the second end of the collector to emitter path of the second transistor of the first pair, a second input, and an output; and a second operational amplifier connected transistor having an emitter to collector path coupled on a first end to a second end of the collector to emitter path of the first transistor in the third pair and to the second input of the second operational amplifier, a second end of the collector to emitter path of the second operational amplifier being coupled to the second end of the collector to emitter path of the first transistor in the second pair, and a base of the second operational amplifier connected transistor coupled to the output of second operational amplifier.

2. The differential amplifier of claim 1, wherein the second current source means comprises a single current source supplying substantially the same current as the first current source.

3. The differential amplifier of claim 1, wherein the second current source means comprises:

a second current source coupled to the first end of the emitter to collector path of the first transistor of the third pair, the second current source supplying substantially one half of the current of the first current source; and a third current source coupled to the first end of the emitter to collector path of the second transistor of the third pair, the third current source supplying substantially one half of the current of the first current source.

4. The differential amplifier of claim 1, wherein the second current source means supplies a slightly greater current than the first current source to compensate for the extent that alpha is less than one in the second pair of transistors.

5. The differential amplifier of claim 1, wherein sizes of transistors in the first pair of transistors and the third pair of transistors are substantially equal.

6. The differential amplifier of claim 1, wherein the transistors in the first pair of transistors and the third pair of transistors are PNP transistors.

7. The differential amplifier of claim 1, wherein the transistors in the first pair of transistors and the third pair of transistors are NPN transistors.

8. The differential amplifier of claim 1, further comprising:

a first load impedance connected between the second ends of the emitter to collector paths of the first pair of transistors; and a second load impedance substantially equal to the first load impedance connected between the second ends of the emitter to collector paths of the third pair of transistors to substantially eliminate the effect of the first load impedance from the voltage at the output of the differential amplifier.

9. The differential amplifier of claim 1, wherein the first input for each of the first and second operational amplifiers is a noninverting input, and wherein the second input for each of the first and second operational amplifiers is an inverting input.

10. A differential amplifier comprising:

a first current source;

a first pair of transistors, each transistor in the first pair having a base coupled to an input of the differential amplifier, an emitter coupled to the first current source, and a collector coupled to an output of the differential amplifier;

a second pair of transistors, a first transistor in the second pair having a collector coupled to a collector of a first transistor in the first pair, an emitter coupled through a resistive element to ground and a base connected to a voltage reference, and a second transistor in the second pair having a collector coupled to a collector of a second transistor in the first pair, an emitter coupled through a resistive element to ground, and a base connected to the voltage reference;

a second current source means;

a third pair of transistors, each transistor in the third pair having an emitter connected to the second current source means, a first transistor in the third pair having a base coupled to a base of a first transistor in the first pair, and a second transistor in the third pair having a base coupled to a base of a second transistor in the first pair;

a first operational amplifier having a first input coupled to the collector of the first transistor of the first pair, a second input, and an output;

a first operational amplifier connected transistor having an emitter coupled to the collector of the second transistor in the third pair and to the second input of the first operational amplifier, a collector coupled to the emitter of the second transistor in the second pair, and a base coupled to an output of the first operational amplifier;

a second operational amplifier having a first input coupled to the collector of the second transistor of the first pair, a second input, and an output; and a second operational amplifier connected transistor having an emitter coupled to the collector of the first transistor in the third pair and to the second input of the second operational amplifier, a collector coupled to the emitter of the first transistor in the second pair, and a base coupled to the output of second operational amplifier.

11. A differential amplifier comprising:

a first current source;

a first pair of transistors, each transistor in the first pair having a gate coupled to an input of the differential amplifier, and a source to drain path with a first end coupled to the first current source and a second end coupled to the output of the differential amplifier;

a second pair of transistors, a first transistor in the second pair having a source to drain path with a first end coupled to the second end of the source to drain path of a first transistor in the first pair and a second end coupled through a resistive element to ground, and a second transistor in the second pair having a source to drain path with a first end coupled to the second end of the source to drain path of a second transistor in the first pair and a second end coupled through a resistive element to ground, the transistors of the second pair each having a gate coupled to the voltage reference;

a second current source means;

a third pair of transistors, each transistor in the third pair having a source to drain path coupled on a first end to the second current source means, a first transistor in the third pair having a gate coupled to a gate of a first transistor in the first pair, and a second transistor in the third pair having a gate coupled to a gate of a second transistor in the first pair;

a first operational amplifier having a first input coupled to the second end of the source to drain path of the first transistor of the first pair, a second input, and an output;

a first operational amplifier connected transistor having a source to drain path with a first end coupled to the second input of the first operational amplifier and to a second end of the source to drain path of the second transistor in the third pair, a second end coupled to the second end of the source to drain path of the second transistor in the second pair, and a gate coupled to an output of the first operational amplifier;

a second operational amplifier having a first input coupled to the second end of the source to drain path of the second transistor of the first pair, a second input, and an output; and a second operational amplifier connected transistor having a source to drain path with a first end coupled to the second input of the second operational amplifier and to a second end of the source to drain path of the first transistor in the third pair, and a second end coupled to the second end of the source to drain path of the first transistor in the second pair, and a gate coupled to the output of the second operational amplifier.

12. The differential amplifier of claim 11, wherein the second current source means comprises a single current source supplying substantially the same current as the first current source.

13. The differential amplifier of claim 11, wherein the second current source means comprises:

a second current source coupled to the first end of the emitter to collector path of the first transistor of the third pair, the second current source supplying substantially one half of the current of the first current source; and a third current source coupled to the first end of the emitter to collector path of the second transistor of the third pair, the third current source supplying substantially one half of the current of the first current source.

14. The differential amplifier of claim 11, wherein the transistors in the first pair of transistors and the third pair of transistors are PMOS transistors.

15. The differential amplifier of claim 11, wherein the transistors in the first pair of transistors and the third pair of transistors are NMOS transistors.

16. The differential amplifier of claim 11, further comprising:

a first load impedance coupled between the second ends of the emitter to collector paths of the first pair of transistors; and a second load impedance substantially equal to the first load impedance coupled between the second ends of the emitter to collector paths of the third pair of transistors to substantially eliminate the effect of the first load impedance from the voltage at the output of the differential amplifier.

17. The differential amplifier of claim 11, wherein the first input for each of the first and second operational amplifiers is a noninverting input, and wherein the second input for each of the first and second operational amplifiers is an inverting input.

* * * * *